(12) United States Patent
Hsiao et al.

(10) Patent No.: US 9,122,162 B2
(45) Date of Patent: Sep. 1, 2015

(54) EXPOSURE APPARATUS, METHOD OF FORMING PATTERNED LAYER, METHOD OF FORMING PATTERNED PHOTORESIST LAYER, ACTIVE DEVICE ARRAY SUBSTRATE AND PATTERNED LAYER

(71) Applicant: Au Optronics Corporation, Hsinchu (TW)

(72) Inventors: Hsiang-Chih Hsiao, Keelung (TW); Ta-Wen Liao, Hsinchu County (TW); Tzu-Min Yang, Changhua County (TW); Shan-Fang Chen, Taichung (TW); Ya-Ping Chang, Chiayi County (TW); Chi-Hung Yang, Taichung (TW); Chung-Yuan Liao, Nantou County (TW)

(73) Assignee: Au Optronics Corporation, Hsinchu (TW)

( * ) Notice: Subject to any disclaimer, the term of this patent is extended or adjusted under 35 U.S.C. 154(b) by 90 days.

(21) Appl. No.: 13/831,760

(22) Filed: Mar. 15, 2013

(65) Prior Publication Data

US 2013/0235316 A1    Sep. 12, 2013

Related U.S. Application Data

(62) Division of application No. 12/947,825, filed on Nov. 17, 2010, now Pat. No. 8,427,631.

(30) Foreign Application Priority Data

Mar. 15, 2010   (TW) ................................ 99107470 A

(51) Int. Cl.
*G02F 1/1343*   (2006.01)
*G03F 7/20*     (2006.01)
*G03B 27/58*    (2006.01)
*G03F 1/00*     (2012.01)

(52) U.S. Cl.
CPC ............ *G03F 7/20* (2013.01); *G02F 1/134309* (2013.01); *G03B 27/58* (2013.01); *G03F 1/14* (2013.01); *G03F 7/70208* (2013.01); *Y10T 428/24802* (2015.01)

(58) Field of Classification Search
CPC .......................... G02F 1/13409; G02F 1/1393
USPC .................................................. 349/130, 139
See application file for complete search history.

(56) References Cited

U.S. PATENT DOCUMENTS

| | | | |
|---|---|---|---|
| 6,727,028 B2 | 4/2004 | Kotani et al. | |
| 2002/0160279 A1 | 10/2002 | Kotani et al. | |
| 2005/0036085 A1* | 2/2005 | Sunohara et al. | ............. 349/106 |
| 2009/0029267 A1 | 1/2009 | Cho | |

FOREIGN PATENT DOCUMENTS

| | | |
|---|---|---|
| TW | 550689 | 9/2003 |
| TW | 200401336 | 1/2004 |

OTHER PUBLICATIONS

"Office Action of Taiwan Counterpart Application", issued on Aug. 22, 2013, p. 1-8.

* cited by examiner

*Primary Examiner* — Thanh-Nhan P Nguyen
(74) *Attorney, Agent, or Firm* — Jianq Chyun IP Office

(57) ABSTRACT

An exposure apparatus is provided and adapted for exposing a photoresist layer on a layer to form a plurality of strip exposed patterns. The exposure apparatus includes a light source, a lens group and a mask. The lens group is disposed between the photoresist layer and the light source and includes a plurality of strip lens parallel to each other, wherein an overlapping region between any two neighboring strip lens is defined as a lens connecting region, and the other regions excluding the lens connecting regions are defined as lens regions. The mask is disposed between the photoresist layer and the lens group and includes a plurality of shielding patterns, wherein an outline of the shielding patterns corresponds to the strip exposed patterns, each shielding pattern has a strip opening, and an extension direction of the strip openings is substantially parallel to an extension direction of the shielding patterns.

6 Claims, 5 Drawing Sheets

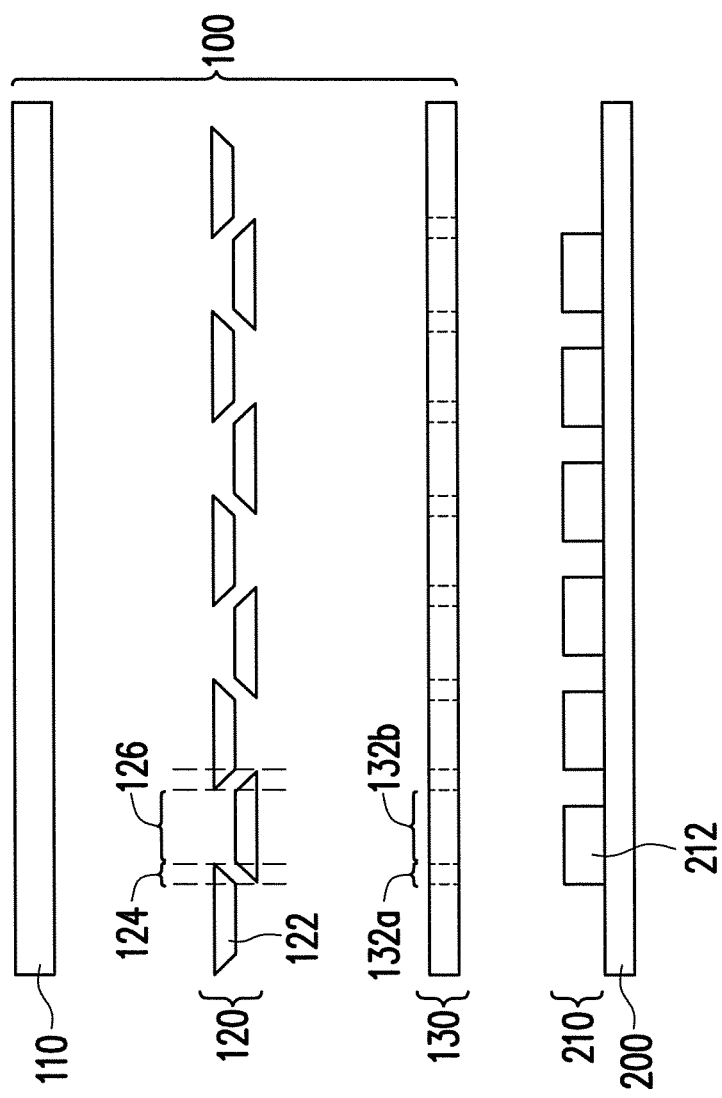

EXPOSURE APPARATUS, METHOD OF FORMING PATTERNED LAYER, METHOD OF FORMING PATTERNED PHOTORESIST LAYER, ACTIVE DEVICE ARRAY SUBSTRATE AND PATTERNED LAYER

CROSS-REFERENCE TO RELATED APPLICATION

This application is a Divisional of and claims the priority benefit of U.S. patent application Ser. No. 12/947,825, filed on Nov. 17, 2010, now allowed, which claims the priority benefits of Taiwan application Ser. No. 99107470, filed on Mar. 15, 2010. The entirety of each of the above-mentioned patent applications is hereby incorporated by reference herein and made a part of this specification.

BACKGROUND OF THE INVENTION

1. Field of the Invention

The invention relates generally to an exposure apparatus, and more particularly, to an exposure apparatus with favorable performance.

2. Description of Related Art

With the continuous advancement of the liquid crystal display (LCD) device towards to the large-size display standard, the market is gravitating towards LCDs having characteristics such as high contrast ratio, rapid response, and wide viewing angle. Therefore, the wide viewing angle techniques of the liquid crystal display panel are continuously developed in order to enhance the viewing angle of the large-size display device. At the current stage, LCD panels employing the multi-domain vertical alignment (MVA) technique are some of the most common, for example, the MVA LCD panel and the polymer stabilized alignment (PSA) LCD panel are popular.

Taking the PSA-LCD panel for example, the pixel electrodes in a PSA-LCD panel include a plurality of strip patterns, and slits are used to separate each set of strip patterns. The strip patterns can divide the pixel electrodes into four alignment regions (domains), for example, which are conducive to the liquid crystal molecules in the liquid crystal layer tilting in different directions, thereby meeting a wide viewing angle requirement. However, in view of current technologies, a line width of each strip pattern and a spacing (e.g., a width of the slits) between two neighboring strip patterns are typically 5 μm and 3 μm, respectively. When line width/spacing is 5 μm/3 μm, liquid crystal efficiency of the PSA-LCD panel is not good enough. Therefore, in order to further enhance the liquid crystal efficiency of the PSA-LCD panel, the widths of the strip patterns and the slits need to be reduced.

Typically, a pitch of the strip patterns is mainly determined by the patterned photoresist layer of the mask layer, and the pitch of the patterned photoresist layer is determined by the design of the width and the pattern of the shielding patterns of the mask. Moreover, since a lens group of an exposure apparatus is formed by a plurality of strip lenses arranged parallel to each other, an overlapping region is formed between any two neighboring strip lenses. Due to the inferior optical characteristics of these overlapping regions, a light passing through the overlapping regions tends to be weak. In other words, under a same exposure condition, the formation of the overlapping regions results in an insufficient exposure dosage for the photoresist material layer corresponding to the overlapping regions. Consequently, photoresist patterns having large line widths and small spacings are formed. Therefore, although the strip patterns formed by using the photoresist patterns as the mask have a same pitch (e.g., a sum of the line width and spacing is the same), the strip patterns have different line width/spacing ratios, thereby causing an issue of bright and dark lines for the display of the PSA-LCD panel, which is a phenomenon known as "lens mura".

SUMMARY OF THE INVENTION

An aspect of the invention provides an exposure apparatus capable of exposing a small pitch.

Another aspect of the invention provides a method of forming a patterned layer and a patterned photoresist layer employing the aforesaid exposure apparatus for performing an exposure process, so as to form a pattern having a small pitch.

Another aspect of the invention provides an active device array substrate, in which patterns distributed in different regions have different critical dimensions.

Another aspect of the invention provides a patterned layer, in which patterns distributed in different regions have different line width/spacing ratios. An aspect of the invention provides an exposure apparatus adapted for exposing a photoresist layer on a layer to form a plurality of strip exposed patterns on the photoresist layer, in which the exposure apparatus includes a light source, a lens group, and a mask. The lens group is disposed between the photoresist layer and the light source. The lens group includes a plurality of strip lenses arranged parallel to each other, in which an overlapping region between any two neighboring strip lenses is defined as a lens connecting region, and the other regions excluding the lens connecting regions are defined as a plurality of lens regions. The mask is disposed between the photoresist layer and the lens group, in which the mask has a plurality of shielding patterns, an outline of the shielding patterns correspond to the strip exposed patterns, each of the shielding patterns respectively has a strip opening, and an extension direction of the strip openings is substantially parallel to an extension direction of the shielding patterns.

Another aspect of the invention provides a method of forming a patterned layer. A photoresist layer is formed on a layer. The layer with the photoresist layer formed thereon is then disposed in the aforesaid exposure apparatus, for performing an exposure process on the photoresist layer. Thereafter, a development process is performed on the photoresist layer, so as to form a patterned photoresist layer on the layer. The layer is then patterned by using the patterned photoresist layer as a mask.

Another aspect of the invention provides a method of forming a patterned photoresist layer. A photoresist layer is disposed in the aforesaid exposure apparatus, for performing an exposure process on the photoresist layer. Thereafter, a development process is performed on the photoresist layer, so as to form a patterned photoresist layer on the layer.

An aspect of the invention provides an active device array substrate. The active device array substrate includes a plurality of first regions and a plurality of second regions, in which a critical dimension of a patterned layer in the first regions is CD1, the second regions include a plurality of compensation regions distributed, a critical dimension of the patterned layer distributed in the compensation regions is CD2, a critical dimension of the patterned layer distributed inside the second region and outside of the compensation regions is CD3, and the critical dimension CD2 is smaller than the critical dimension CD3. For example, the compensation regions are distributed randomly in the second regions.

Another aspect of the invention provides a patterned layer. The patterned layer includes a plurality of pixel electrodes arranged in array. Each of the pixel electrodes includes a plurality of strip patterns arranged in different extension directions. The patterned layer has a plurality of first regions and a plurality of second regions, in which a line width/spacing ratio of the pixel electrodes in the first regions is L1/S1, the second regions include a plurality of compensation regions distributed, a line width/spacing ratio of the pixel electrodes distributed in the compensation regions is L2/S2, a line width/spacing ratio of the pixel electrodes distributed inside the second region and outside of the compensation regions is L3/S3, and the line width/spacing ratio L2/S2 is smaller than the line width/spacing ratio L3/S3. For example, the compensation regions are distributed randomly in the second regions.

In summary, a pattern having a small pitch may be formed by the exposure apparatus according to an embodiment of the invention. Moreover, since the shielding patterns of the mask are designed in accordance with the lens group, a variation in optical characteristics between the lens connecting regions and the lens regions of the lens group may be minimized.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A is a schematic view of an exposure apparatus in accordance with an embodiment of the invention.

DESCRIPTION OF EMBODIMENTS

Figure 1B:
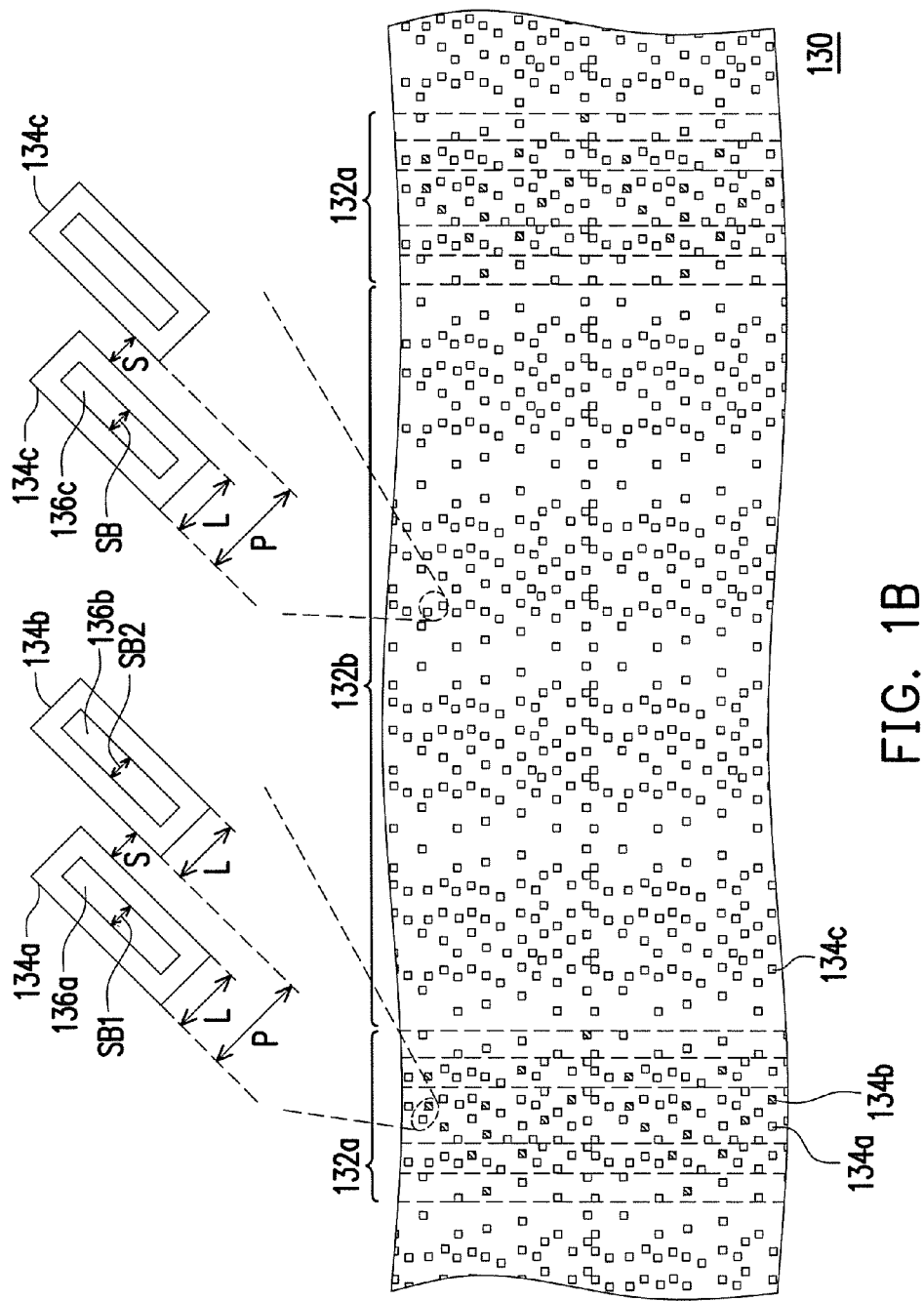
FIG. 1B is a schematic top view of a mask depicted in FIG. 1A.

FIG. 1A is a schematic view of an exposure apparatus in accordance with an embodiment of the invention, and FIG. 1B is a schematic top view of a mask depicted in FIG. 1A. Referring to FIG. 1A, according to the present embodiment of the invention, an exposure apparatus 100 is adapted for exposing a photoresist layer 210 on a layer 200 to form a plurality of strip exposed patterns 212 on the photoresist layer 210. The exposure apparatus 100 includes a light source 110, a lens group 120, and a mask 130. The light source 110 may be a Krypton Fluoride (KrF) laser, an Argon Fluoride (ArF) laser, a Fluoride (F) laser, or any other suitable exposure light sources known in the art. The lens group 120 is disposed between the photoresist layer 210 and the light source 110. The lens group 120 includes a plurality of strip lenses 122 arranged parallel to each other, and an overlapping region between any two neighboring strip lenses 122 is defined as a lens connecting region 124. The other regions excluding the lens connecting regions 124 are defined as a plurality of lens regions 126. In other words, the lens group 120 includes the plurality of alternately arranged lens connecting regions 124 and the lens regions 126. The optical characteristics of the lens connecting regions 124 are typically inferior to the optical characteristics of the lens regions 126. For example, a transmittance of the lens connecting regions 124 may be lower than a transmittance of the lens regions 126.

Referring to FIGS. 1A and 1B, the mask 130 is disposed between the photoresist layer 210 and the lens group 120, and the mask 130 has a plurality of shielding patterns 134a, 134b, and 134c. An outline of the shielding patterns 134a, 134b, and 134c corresponds to the strip exposed patterns 212, and each of the shielding patterns 134a, 134b, and 134c respectively has a strip opening 136a, 136b, and 136c. Moreover, an extension direction of the strip openings 136a, 136b, and 136c is substantially parallel to an extension direction of the shielding patterns 134a, 134b, and 134c. In the present embodiment, the outline of the shielding patterns 134a, 134b, and 134c is strip-shaped, for example, and the extension direction of the shielding patterns 134a, 134b, and 134c may be the same or different. A line width of the shielding patterns 134a, 134b, and 134c is L, a spacing between any two neighboring shielding patterns 134a, 134b, and 134c is S, and a sum of the line width L and the spacing S (e.g., a pitch P) is about 6 μm, for example. In an embodiment of the invention, for example, the line width L is about 4 μm and the spacing S is about 2 μm. In another embodiment of the invention, the line width L may be about 3.5 μm, whereas the spacing S may be about 2.5 μm.

Referring to FIG. 1B, in the present embodiment, the mask 130 has a plurality of first exposure regions 132a and a plurality of second exposure regions 132b, for example, and the first exposure regions 132a and the second exposure regions 132b are alternately arranged. Each of the first exposure regions 132a respectively corresponds to one of the lens connecting regions 124, for example, and each of the second exposure regions 132b respectively corresponds to one of the lens regions 126. It should be noted that, "corresponding" herein means that a light emitted by the light source 110 irradiates towards the first exposure regions 132a after passing through the lens connecting regions 124, and the light emitted by the light source 110 irradiates towards the second exposure regions 132b after passing through the lens regions 126. The shielding patterns 134a and 134b disposed in the first exposure regions 132a include a plurality of first shielding patterns 134a and a plurality of second shielding patterns 134b, for example. Each of the first shielding patterns 134a respectively has a first strip opening 136a, and each of the second shielding patterns 134b respectively has a second strip opening 136b. A width of each of the first strip openings is SB1, a width of each of the second strip openings is SB2, and the width SB1 is smaller than the width SB2. In the present embodiment, the second shielding patterns 134b are distributed randomly on average in the first exposure regions 132a. Alternatively, the randomly distributed second shielding patterns 134b in the first exposure regions 132a may have a decreasing distribution density from a center towards the two sides, similar to a Gaussian distribution, for example. The distribution density of the second shielding patterns 134b in a central area of the first exposure regions 132a may be about 30%, for example, and the distribution densities from the center to the two sides may be about 20% and 10%, respectively. However, the invention is not limited thereto, the distribution of the second shielding patterns 134b may be varied according to user and design demands.

In the present embodiment, in the second exposure regions 132b, a width of the strip opening 136c of each of the shielding patterns 134c is SB, and the width SB is substantially equal to the width SB1. Moreover, the widths SB1, SB2, and SB of the strip openings 136a, 136b, 136c are a finest resolution of the exposure apparatus 100, for example, pattern of the strip openings 136a, 136b, and 136c are not transferred on the photoresist layer 210 during an exposure process accordingly. In the present embodiment, the width SB1 is about 1.0 the width SB2 is about 1.1 μm, and the width SB is about 1.0 μm, for example. In the first exposure regions 132a, the width SB1 of the strip opening 136a is substantially equal to the width SB of the strip opening 136c in the second exposure regions 132b, for example. Additionally, the width SB2 of the strip opening 136b is larger than the width SB of the strip opening 136c in the second exposure regions 132b, for example. Therefore, under the same light source intensity, when compared with the strip openings 136a and 136c, the strip opening 136b may allow more light to pass through. Accordingly, a width difference of the strip openings 136a, 136b and 136c of the shielding patterns 134a, 134b, and 134c may compensate for a variation in optical characteristics for different regions of the lens group 120.

Typically, current exposure apparatus can achieve a sum of line width L and spacing S (e.g., a pitch P) of about 8 μm. On the other hand, by designing the strip openings 136a, 136b, and 136c in the shielding patterns 134a, 134b, and 134c of the mask 130, the exposure apparatus 100 according to the present embodiment of the invention may surpass a current fabrication limit, and thereby obtain a pattern having a substantially small pitch P. Moreover, since the shielding patterns 134a, 134b, and 134c of the mask 130 described in the present embodiment are designed in accordance with the lens connecting regions 124 and lens regions 126 of the lens group 120, the difference in optical characteristics between the lens connecting regions 124 and the lens regions 126 may be minimized.

Figure 2A:
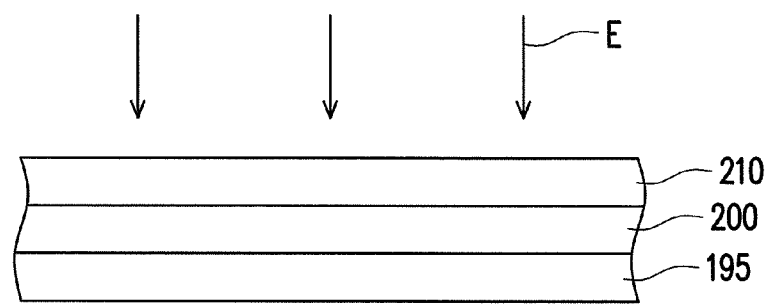
FIGS. 2A-2C are schematic cross-sectional views illustrating a method of forming a patterned layer in accordance with an embodiment of the invention.
Figure 2B:
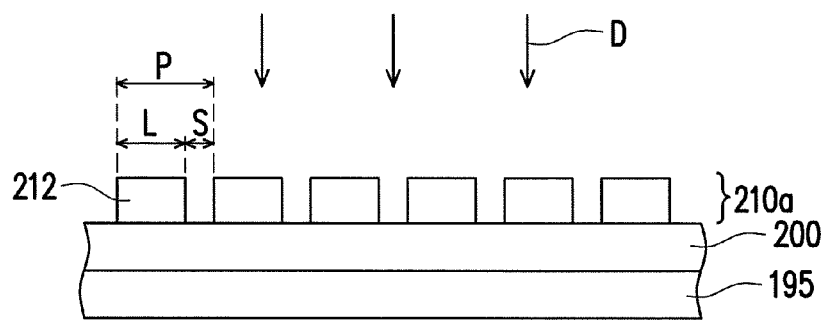
Figure 2C:
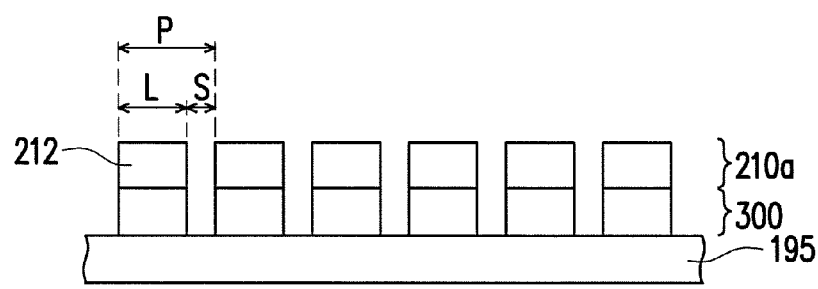

A method of forming a patterned layer by using the exposure apparatus 100 depicted in FIG. 1 is described hereafter. FIGS. 2A-2C are schematic cross-sectional views illustrating a method of forming a patterned layer in accordance with an embodiment of the invention. Referring to FIG. 2A, a photoresist layer 210 is formed on a layer 200. In the present embodiment, the layer 200 is formed on a material layer 195, for example. Moreover, a material of the layer 200 includes indium tin oxide (ITO), indium zinc oxide (IZO), or other suitable transparent conductive materials for fabricating pixel electrodes, for example. The photoresist layer 210 is a positive photoresist, and a forming method thereof includes a spin coating method, for example. The layer 200 with the photoresist layer 210 formed thereon is then disposed in the exposure apparatus 100 depicted in FIG. 1, for performing an exposure process E on the photoresist layer 210.

Referring to FIG. 2B, a development process D is then performed on the photoresist layer 210, so as to form a patterned photoresist layer 210a on the layer 200. The patterned photoresist layer 210a includes a plurality of strip exposed patterns 212. In the mask 130 of the exposure apparatus according to present embodiment, a line width of the shielding patterns 134a, 134b, and 134c is L, a spacing between any two neighboring shielding patterns 134a, 134b, and 134c is S, and a sum of the line width L and the spacing S (e.g., a pitch P) is about 6 μm, for example. Therefore, the strip exposed patterns 212 of the patterned photoresist layer 210a has a line width L and a spacing S, for example, and a sum of the line width L and the spacing S (e.g., a pitch P) is about 6 μm, for example. Moreover, it should be noted that, although strip openings 136a, 136b, and 136c are designed in the shielding patterns 134a, 134b, and 134c of the mask 130, since the widths SB1, SB2, and SB of the strip openings 136a, 136b, and 136c are smaller than the finest resolution of the exposure apparatus 100, for example, the pattern of the strip openings 136a, 136b, and 136c are not transferred on the patterned photoresist layer 210a during the exposure process.

Thereafter, referring to FIG. 2C, by using the patterned photoresist layer 210a as a mask, the layer 200 is patterned to form a patterned layer 300. In the present embodiment of the invention, a method of patterning the layer 200 includes a dry etching process or a wet etching process, for example. Moreover, according to a design and user requirement for the shielding patterns 134a, 134b, and 134c of the mask 130, the patterned layer 300 may be form to constitute a plurality of devices. To facilitate description in the disclosure hereafter, the patterned layer 300 is disposed in a device layer of an active device array substrate.

Figure 3:
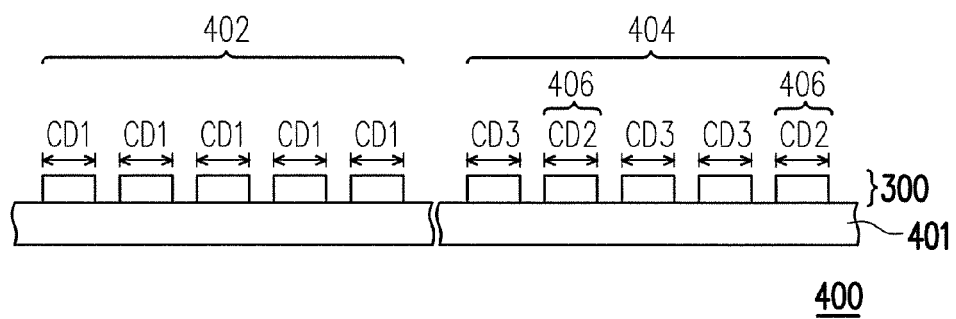
FIG. 3 is a schematic view of an active device array substrate in accordance with an embodiment of the present invention.

FIG. 3 is a schematic view of an active device array substrate in accordance with an embodiment of the invention. Referring to FIG. 3, in the present embodiment, an active device array substrate 400 includes a substrate 401 and a patterned layer 300 formed on the substrate 401. The active device array substrate 400 has a plurality of first regions 402 and a plurality of second regions 404. A critical dimension of the patterned layer 300 in the first regions 402 is CD1, and the second regions 404 include a plurality of compensation regions 406 distributed therein. For instance, the compensation regions 406 are distributed randomly in the second regions 404 randomly. A critical dimension of the patterned layer 300 distributed in the compensation regions 406 is CD2, and a critical dimension of the patterned layer 300 distributed inside the second region and outside of the compensation regions 406 is CD3. Moreover, the critical dimension CD2 is smaller than the critical dimension CD3.

In the present embodiment, the patterned layer 300 depicted in FIG. 3 is formed by the exposure apparatus 100 shown in FIG. 1A, for example. The first regions 402 and the second regions 404 of the active device array substrate 400 respectively correspond to the second exposure regions 132b and the first exposure regions 132a of the mask 130, whereas the compensation regions 406 correspond to the first exposure regions 132a distributed by the second shielding patterns 134b. Additionally, the patterned layer 300 in the first regions 402 having the critical dimension CD1 corresponds to the shielding patterns 134c of the second exposure regions 132b. The patterned layer 300 in the compensation regions 406 having the critical dimension CD2 corresponds to the second shielding patterns 134b of the first exposure regions 132a. The patterned layer 300 distributed inside the second region and outside of the compensation regions 406 having the critical dimension CD3 corresponds to the first shielding patterns 134a of the first exposure regions 132a. Furthermore, in the present embodiment, the compensation regions 406 are distributed in the second regions 404. For example, the compensation regions 406 are distributed randomly in the second regions 404. However, in another embodiment of the invention, although the compensation regions 406 may still be randomly distributed in the second regions 404, a ratio of an area occupied by the compensation regions 406 may be decreasing from a center to the two sides, similar to a Gaussian distribution, for example. A distribution density of the compensation regions 406 in a central area of the second regions 404 is about 30%, for example, and the distribution density from the center to the two sides are about 20% and 10%, respectively. However, the invention is not limited thereto, the distribution of the compensation regions 406 may be varied according to user and design demands. It should be mentioned that, since in theory the critical dimension CD1 is smaller than the critical dimension CD3, an embodiment of the invention correspondingly designs a pattern having a small critical dimension CD2 (e.g., smaller than the critical dimension CD1) in order to perform compensation. However, since the critical dimension CD1 of each of the regions in the active device array substrate may be varied, the critical dimension CD1 may be substantially equal to the critical dimension CD3. Moreover, the critical dimensions CD1 and CD3 are about 4.5 µm or about 3.5 µm, for example.

In the active device array substrate 400 according to the present embodiment, the patterned layer 300 in the first regions 402 has the critical dimension CD1, and the patterned layer 300 in the second regions 404 has the critical dimensions CD2 and CD3. When the active device array substrate 400 is applied in a display panel such as a PSA-LCD panel, and the patterned layer 300 includes a plurality of pixel electrodes arranged in array, strip patterns of pixel electrodes in different regions may have different critical dimensions. Accordingly, by combining the use of strip patterns having different critical dimensions CD2 and CD3, an overall brightness of a display image corresponding to the second regions 404 substantially approaches an overall brightness of a display image corresponding to the first regions 402. Therefore, the active device array substrate 400 according to the present embodiment may mitigate an issue of "lens mura", thereby enhancing a display quality of the panel.

Figure 4:
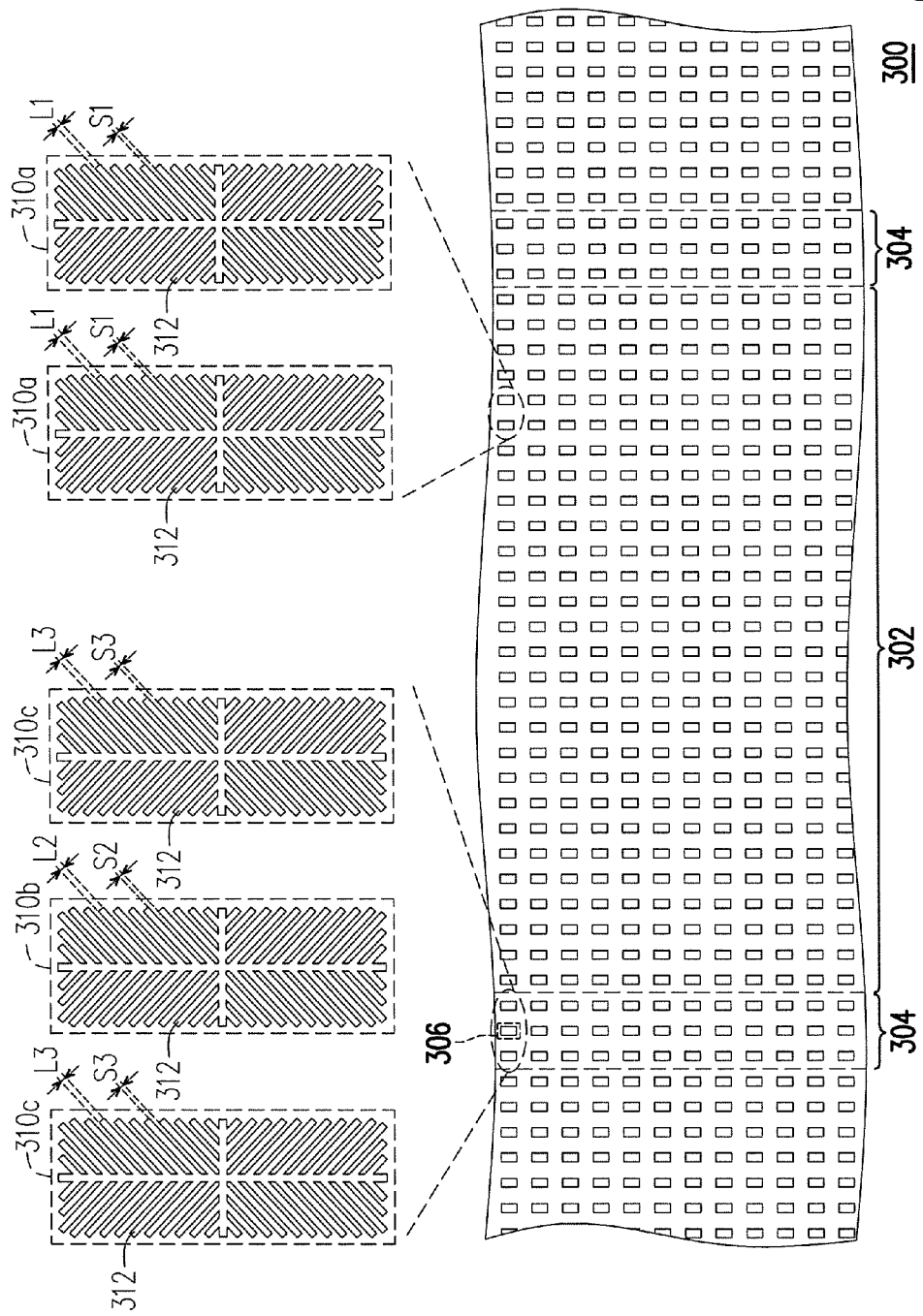
FIG. 4 is a schematic top view of a patterned layer in accordance with an embodiment of the invention.

FIG. 4 is a schematic top view of a patterned layer in accordance with an embodiment of the invention. Referring to FIG. 4, in the present embodiment, the patterned layer 300 includes a plurality of pixel electrodes 310a, 310b, and 310c arranged in array, and each of the pixel electrodes 310a, 310b, and 310c includes a plurality of strip patterns 312 arranged in different extension directions. In the present embodiment, the pixel electrodes 310a, 310b, and 310c are polymer stabilized alignment pixel electrodes, for example, and each of the pixel electrodes 310a, 310b, and 310c is divided into four alignment regions, for example. It should be noted that, although FIG. 4 exemplifies an embodiment by disposing three columns of pixel electrodes 310b and 310c and the compensation regions 306 in the center of the second regions 304, this is done merely for clarity of illustration and not for limiting the invention. In other words, the invention does not place a restriction on conditions such as the number of pixel electrodes 310a, 310b, and 310c, the arrangement and the extension direction of the strip patterns 312 of the pixel electrodes 310a, 310b, and 310c, and the distribution of the compensation regions 306 in the second regions 304. Therefore, a user may design according to actual circumstances and demands.

As shown in FIG. 4, the patterned layer 300 has a plurality of first regions 302 and a plurality of second regions 304. The first regions 302 and the second regions 304 are alternately arranged, for example.

A line width/spacing ratio of the pixel electrodes 310a in the first regions 302 is L1/S1. The second regions 304 include a plurality of distributed compensation regions 306. For example, the compensation regions 306 are distributed randomly in the second regions 404 randomly. A line width/spacing ratio of the pixel electrodes 310b distributed in the compensation regions 306 is L2/S2, and a line width/spacing ratio of the pixel electrodes 310c distributed inside the second region 304 and outside of the compensation regions 306 is L3/S3. Moreover, the line width/spacing ratio L2/S2 is smaller than the line width/spacing ratio L3/S3. The line width/spacing ratio L1/S1 of the pixel electrodes 310a is equal to the line width/spacing ratio L3/S3 of the pixel electrodes 310c. In the present embodiment, a range of the line width/spacing ratio L1/S1 is about 1.4-3, a range of the line width/spacing ratio L2/S2 is about 0.7-1.3, and a range of the line width/spacing ratio L3/S3 is about 1.4-3. In addition, the line widths L1 and L3 are about 4.5 µm, and the spacings S1 and S3 are about 1.5 µm, for example. In another embodiment of the invention, the line widths L1 and L3 are about 3.5 µm, and the spacings S1 and S3 are about 2.5 µm, for example. However, the invention is not limited thereto, the compensation regions 306 may be randomly distributed in the second regions 304 or distributed according to user and design demands. According to an embodiment of the invention, a ratio of an area occupied by the compensation regions 306 may be decreasing from a center to the two sides, similar to a Gaussian distribution, for example. A distribution density of the compensation regions 306 in a central area of the second regions 304 is about 30%, for example, and the distribution density from the center to the two sides are about 20% and 10%, respectively, although the invention is not limited thereto.

It should be noted that, in the present embodiment, the patterned layer 300 depicted in FIG. 4 is formed by the exposure apparatus 100 shown in FIG. 1A, for example. The first regions 302 and the second regions 304 of the patterned layer 300 respectively correspond to the second exposure regions 132b and the first exposure regions 132a of the mask 130, whereas the compensation regions 306 correspond to the first exposure regions 132a distributed by the second shielding patterns 134b. The strip patterns 312 of the pixel electrodes 310a correspond to the shielding patterns 134c, and the strip patterns 312 of the pixel electrodes 310c and the pixel electrodes 310b respectively correspond to the first shielding patterns 134a and the second shielding patterns 134b. In other words, the first regions 302 correspond to the lens regions 126, and the second regions 304 correspond to the lens connecting regions 124.

In the present embodiment, the pixel electrodes 310a, 310b, and 310c formed by the exposure apparatus 100 depicted in FIG. 1 have small line widths L1, L2, and L3 as well as small spacings S1, S2, and S3. Therefore, the liquid crystal efficiency is enhanced, and thereby the display image has a high brightness. Moreover, according to the present embodiment, the pixel electrodes 310a having the line width/spacing ratio L1/S1 are disposed in the first regions 302 of the patterned layer 300, and the pixel electrodes 310b and 310c having different line width/spacing ratios L2/S2 and L3/S3 are disposed in the second regions 304. Accordingly, by combining the use of the pixel electrodes 310b and the pixel electrodes 310c, an overall brightness of a display image corresponding to the second regions 304 substantially approaches an overall brightness of a display image corresponding to the first regions 302 where the pixel electrodes 310a are disposed. Therefore, an issue of "lens mura" is mitigated, thereby enhancing a display quality of the panel.

In light of the foregoing, in the exposure apparatus according to an embodiment of the invention, the shielding patterns of the mask have strip openings such that a pattern having a small pitch may be formed by the exposure apparatus. Moreover, since the shielding patterns of the mask correspond to the design of the lens group, the variation n optical characteristics between the lens connecting regions and the lens regions of the lens group may be minimized. Consequently, when the patterned layer formed by the exposure apparatus according to an embodiment is applied in formation of pixel electrodes, the liquid crystal efficiency is enhanced and "lens mura" can be improved.

Furthermore, in practice, the light source and the exposure conditions used by the exposure apparatus according to an embodiment of the invention are substantially the same with those known conventionally. Therefore, according to actual demands, masks having different shielding patterns may be designed, and thus fabrication costs are not drastically increased. Moreover, by using the method of forming the patterned layer according to an embodiment of the invention to fabricate the pixel electrodes of the active device array substrate, a yield rate of the display panel is significantly enhanced. In addition, cost increase due to the "lens mura" may be prevented.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A patterned layer comprising a plurality of pixel electrodes arranged in array, each of the pixel electrodes comprising a plurality of strip patterns arranged in different extension directions, the patterned layer having a plurality of first regions and a plurality of second regions, wherein an area of the first regions is greater than an area of the second regions, a line width/spacing ratio of the pixel electrodes in the first regions is L1/S1, the second regions comprise a plurality of compensation regions distributed, a line width/spacing ratio of the pixel electrodes distributed in the compensation regions is L2/S2, a line width/spacing ratio of the pixel electrodes distributed inside the second region and outside of the compensation regions is L3/S3, and the line width/spacing ratio L2/S2 is smaller than the line width/spacing ratio L3/S3.

2. The patterned layer as claimed in claim 1, wherein the pixel electrodes are polymer stabilized alignment pixel electrodes.

3. The patterned layer as claimed in claim 1, wherein a range of the line width/spacing ratio L1/S1 is about 1.4-3.

4. The patterned layer as claimed in claim 1, wherein a range of the line width/spacing ratio L2/S2 is about 0.7-1.3.

5. The patterned layer as claimed in claim 1, wherein a range of the line width/spacing ratio L3/S3 is about 1.4-3.

6. The patterned layer as claimed in claim 1, wherein the compensation regions are distributed randomly in the second regions.

* * * * *